United States Patent
Fischer et al.

(10) Patent No.: US 9,977,842 B2
(45) Date of Patent: May 22, 2018

(54) METHOD AND CONTROL FOR CALCULATING A DATA-BASED FUNCTION MODEL

(71) Applicant: Robert Bosch GmbH, Stuttgart (DE)

(72) Inventors: Wolfgang Fischer, Gerlingen (DE); Andre Guntoro, Pforzheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 1058 days.

(21) Appl. No.: 14/247,865

(22) Filed: Apr. 8, 2014

(65) Prior Publication Data

US 2014/0309973 A1   Oct. 16, 2014

(30) Foreign Application Priority Data

Apr. 10, 2013 (DE) .................. 10 2013 206 320

(51) Int. Cl.
| | |
|---|---|
| *G06F 7/60* | (2006.01) |
| *G06F 17/10* | (2006.01) |
| *G06F 17/50* | (2006.01) |
| *B60W 50/00* | (2006.01) |
| *F02D 41/24* | (2006.01) |
| *F02D 41/26* | (2006.01) |
| *F02D 41/14* | (2006.01) |

(52) U.S. Cl.
CPC ............ *G06F 17/50* (2013.01); *B60W 50/00* (2013.01); *F02D 41/2425* (2013.01); *F02D 41/26* (2013.01); *B60W 2050/0077* (2013.01); *B60W 2050/0083* (2013.01); *F02D 2041/1423* (2013.01)

(58) Field of Classification Search
None
See application file for complete search history.

(56) References Cited

U.S. PATENT DOCUMENTS

| | | | | |
|---|---|---|---|---|
| 2012/0179635 A1* | 7/2012 | Vasudevan | ............. | G06T 7/521 706/12 |
| 2013/0158996 A1* | 6/2013 | Fastow | .................. | G10L 15/08 704/240 |

FOREIGN PATENT DOCUMENTS

DE   10 2010 028259   10/2011

OTHER PUBLICATIONS

Albin, T. et al., "A Hybrid Control Approach for Low Temperature Combustion Engine Control", Dec. 12-15, 2011, 50th IEEE Conference on Decision and Control and European Control Conference (CDC-ECC), IEEE. (Year: 2011).*

* cited by examiner

*Primary Examiner* — Cedric Johnson
(74) *Attorney, Agent, or Firm* — Norton Rose Fulbright US LLP; Gerard Messina

(57) ABSTRACT

A method for carrying out a calculation of a data-based function model in a control unit having a computing unit and a separate model calculation unit having a computing core, including: loading a first part of the configuration data, which contain hyperparameters of the data-based function model and a first part of supporting point data having multiple supporting points, into the model calculation unit; starting a calculation in the computing core of the model calculation unit, to obtain a model value at a predefined test point; and transferring a second part of the configuration data, which contain a second part of the supporting point data having multiple supporting points, into the model calculation unit, prior to the completion of the calculation in the computing core of the model calculation unit.

19 Claims, 3 Drawing Sheets

METHOD AND CONTROL FOR CALCULATING A DATA-BASED FUNCTION MODEL

RELATED APPLICATION INFORMATION

The present application claims priority to and the benefit of German patent application no. 10 2013 206 320.2, which was filed in Germany on Apr. 10, 2013, the disclosure of which is incorporated herein by reference.

FIELD OF THE INVENTION

The present invention relates to control units for calculating function models for carrying out functions, in particular in engine systems. The present invention relates in particular to methods for calculating function models in a model calculation unit separate from a computing unit.

BACKGROUND INFORMATION

Control units having a main computing unit and a separate model calculation unit for calculating data-based function models in a control unit are believed to be discussed in the related art. Thus, for example, the publication DE 10 2010 028 259 A1 discusses a control unit having an additional logic circuit as a model calculation unit, which is configured to calculate exponential functions, to assist in carrying out Bayesian regression methods, which are necessary in particular for calculating Gaussian process models.

The model calculation unit is capable of carrying out mathematical processes to calculate the data-based function model based on parameters and supporting points or training data. In particular, the model calculation unit is configured for the efficient calculation of exponential functions, so that it is possible to calculate Gaussian process models with greater computing speed than in the main computing unit.

Configuration data, which contain parameters and supporting points for calculating the function model, are generally input into the model calculation unit prior to the calculation. A DMA unit is provided for this purpose, which allows the model calculation unit to retrieve the configuration data directly from a memory unit of the control unit without activity of the main computing unit and then to carry out the calculation.

Since the number of the supporting points transferred in addition to the parameters is generally very large, the amount of data which must be transferred into the model calculation unit prior to the start of the calculation of the function model is also very extensive. Therefore, the time required for the calculation of the function model is decisively determined by the loading time and the calculation time.

SUMMARY OF THE INVENTION

According to the present invention, a method for carrying out a calculation of a data-based function model using a computing unit and a separate model calculation unit having a computing core as recited in claim 1 and the control unit and the computer program as recited in the other independent claims are provided.

Further advantageous embodiments of the present invention are specified in the dependent claims.

According to a first aspect, a method is provided for carrying out a calculation of a data-based function model in a control unit using a computing unit and a separate model calculation unit having a computing core. The method includes the following steps:

loading a first part of the configuration data, which contain a first part of supporting point data having multiple supporting points and in particular hyperparameters of the data-based function model, into the model calculation unit;

starting a calculation in the computing core of the model calculation unit, to obtain a model value at a predefined test point; and transferring a second part of the configuration data, which contain a second part of the supporting point data having multiple supporting points, into the model calculation unit, prior to the completion of the calculation in the computing core of the model calculation unit.

In control units for calculating data-based function models, the complex calculation of the function model is carried out in a model calculation unit (logic unit). The model calculation unit is a logic unit which contains hardware, which is configured to carry out specific calculations for data-based function models using hardware, in particular for the joint integration with a computing core. With the aid of this logic unit, a previously trained calculation method, which is stored on the hardware, for a Bayesian regression model is carried out online. The model calculation unit may generally have one or multiple computing cores, which operate independently of one another.

A data-based function model may be divided into multiple smaller partial models and these partial models may be calculated in parallel by the computing cores of the model calculation unit, to reduce the time required for calculating the underlying function model.

Thus, in a model calculation unit having M available computing cores, a calculation of the function model may be carried out using N D-dimensional supporting points. The function model may be divided into up to M partial models, which each have the same number of supporting points or various numbers of supporting points.

Prior to the calculation of the function model, the required configuration data, which contain parameters and supporting point data, must be loaded into the internal memory of the model calculation unit, the calculation of the second partial model being able to be started only when sufficient supporting point data of the relevant partial model are present in the internal memory of the model calculation unit. Since the supporting point data are transmitted successively, the loading time of the supporting point data for the second partial model may only be started when the supporting point data for the first partial model have already been transferred. This means that the calculation of the second partial model and the further partial models may only be started later. This results in an unnecessary waiting time for the calculation of the second and the further partial models, which lengthens the overall calculation time for the data-based function model.

The above-mentioned method for carrying out a calculation of a data-based function model in a separate model calculation unit of a control unit provides for starting the calculation for every partial model to be calculated, before the supporting point data required for this purpose have been completely transferred. Since the calculations are carried out successively with respect to the individual supporting points and a calculation of a single supporting point tends to occupy a longer time than the transfer of the data for a supporting point into the model calculation unit, the calculation of the partial model in the corresponding computer core may already be started after the transfer of a small amount of supporting point data of a partial model.

The time required for calculating a data-based function model may thus be significantly reduced, since a large part of the loading time of the configuration data and the calculation time of the individual partial models overlaps.

Furthermore, the transfer of a second part of the configuration data may be started simultaneously with the calculation in the model calculation unit.

It may be provided that the model calculation unit has multiple computing cores, in which the calculations are started, in particular immediately, after the loading of the first part of the configuration data, the calculations in the computing cores each being carried out using a part of the first part of the supporting points.

In particular in the case of a number M of computing cores, the calculations in the computing cores may each be carried out using assigned supporting points of the first part of the supporting points, the supporting points being assigned to each computing core which result from a successive assignment of groups of one or multiple supporting points from the first part of the supporting points to the individual computing cores, so that the parts of the first part of the supporting points of each Mth group of the one or the multiple supporting points are assigned offset to one another.

Furthermore, the calculation results of the calculations in the individual computing cores may be added up to obtain the overall model value.

In addition, the data-based function model may be a Gaussian process model or may contain such a model.

According to another aspect, a control unit for carrying out a calculation of a data-based function model is provided, including:
  a computing unit;
  a separate model calculation unit having at least one computing core, which is configured to calculate a data-based function model, in particular a Gaussian process model; and
  a DMA unit, which is configured
    to load a first part of the configuration data, which contain a first part of supporting point data having multiple supporting points and in particular hyperparameters of the data-based function model, into the model calculation unit; and
    to transfer a second part of the configuration data, which contain a second part of the supporting point data having multiple supporting points, into the model calculation unit, prior to the completion of the calculation in the computing core of the model calculation unit;
  the computing unit being configured to start a calculation in the computing core of the model calculation unit to obtain a model value at a predefined test point.

Furthermore, the control unit may be configured, if multiple computing cores are present in the model calculation unit, to obtain calculation results from the individual computing cores and add them to the model value.

According to another aspect, a computer program is provided, which is configured for the purpose of executing all steps of the above-mentioned method.

Specific embodiments of the present invention are explained in greater detail hereafter on the basis of the appended drawings.

DETAILED DESCRIPTION

Figure 1:
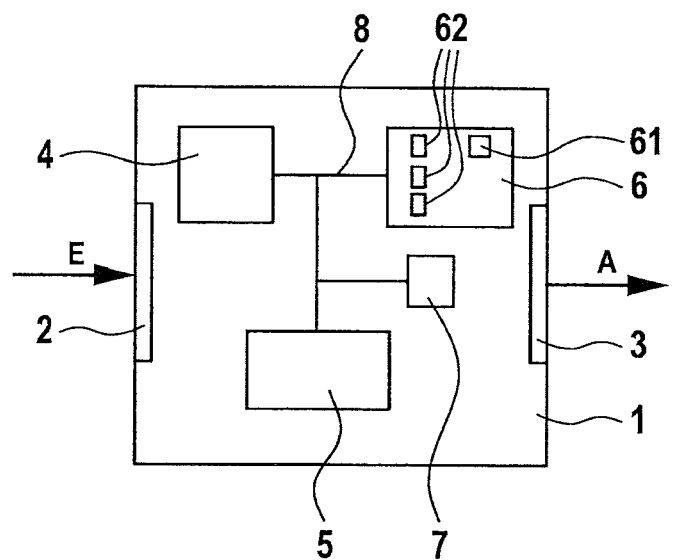
FIG. 1 shows a control unit for calculating a data-based function model.

FIG. 1 schematically shows a view of a control unit, in particular an engine control unit for controlling an internal combustion engine in an engine system. Control unit 1 is configured specifically for calculating data-based function models, in particular for calculating Gaussian process models.

The use of non-parametric, data-based function models is based on a Bayesian regression method. Bayesian regression is a data-based method which is based on a non-parametric model. To prepare the model, training data are required, which contain measuring points as input value combinations of input variables and associated output data of an output variable.

The model is prepared in that supporting point data, which generally correspond to the training data or are selected or generated therefrom, and abstract hyperparameters are determined, which parameterize the space of the model functions and effectively weight the influence of the individual measuring points of the supporting point data on the later model prediction.

As a result of the preparation of the non-parametric, data-based function model one obtains:

$$v_0 = \sum_{p=1}^{N} (Q_y)_i \sigma_f \exp\left(-\frac{1}{2}\sum_{d=1}^{D} \frac{((x_i)_d - u_d)^2}{l_d}\right)$$

where v corresponds to the model value at a test point u, $x_i$ corresponds to a measuring point of the training data, N corresponds to the number of the measuring points of the training data, D corresponds to the dimension of the input data/training data space (number of the input variables), and $l_d$ and $\sigma_f$ correspond to the hyperparameters ascertained from the model training. $Q_y$ is a variable resulting from the hyperparameters and the measuring data.

Control unit 1 for operating a physical system, for example, an internal combustion engine, includes an input interface 2 for receiving one or multiple input variables E and an output interface 3 for outputting one or multiple output variables A, in particular manipulated variables for actuators, for example, a throttle valve actuator, injectors, and the like. Input variables E may include sensor values and predefined values, and are used for the purpose of describing a system state, in particular a state of an internal combustion engine, and pre-defining a setpoint operating state.

FIG. 1 shows a schematic view of a hardware architecture for integrated control unit 1, in which a computing unit 4 and a model calculation unit 6 are provided for the hardware-based calculation of a data-based function model in an integrated way. Computing unit 4 and model calculation unit 6 have a communication link to one another via a system bus 8.

Fundamentally, model calculation unit 6 only has hardware (hardwired) and is preferably not configured for the purpose of executing software code. For this reason, it is also not necessary to provide a processor in model calculation unit 6. This allows a resource-optimized implementation of such a model calculation unit 6.

Control unit 1 includes computing unit 4, which essentially controls the processes in control unit 1. Computing unit 4 is configured to execute control unit software, which carries out the generation of output variable(s) A.

Control unit 1 may be provided to calculate an output variable A based on one or multiple input variables E with the aid of a data-based function model. The configuration data for the data-based function model, which include hyperparameters and supporting point data, are stored in a memory unit 5 and may be input as needed into a model calculation unit 6, which is provided separately from computing unit 4.

Model calculation unit 6 is configured to execute the computing steps required for the individual calculations of the data-based function model efficiently and more rapidly than computing unit 4. In particular, the calculation of exponential functions is executed in hardware. Model calculation unit 6 may include one or multiple computing cores 62, which are each capable of carrying out a model calculation independently of one another.

Model calculation unit 6 may also include, in addition to one or multiple computing cores 62, an internal memory 61, and a DMA unit (DMA=direct memory access). Computing cores 62, internal memory 61, and the DMA unit are connected to one another via an internal communication link.

To be able to carry out the input of the configuration data into model calculation unit 6 without activity of computing unit 4, a DMA unit 7 connected to system connection 8 is provided, for example, to load configuration data directly from memory unit 5 into model calculation unit 6, in particular into an internal memory 61 therein. Memory unit 5 may be configured as a flash memory or as a ROM (read only memory).

The function of DMA unit 7 may be activated directly by computing unit 4. The functionality of DMA unit 7 is to input the configuration data, which are associated with a data-based function model to be calculated and which include hyperparameters of the data-based function model and supporting point data, into model calculation unit 6. The configuration data are input successively, initially the hyperparameters and subsequently the individual supporting point data being read into model calculation unit 6.

The data-based function model may be produced on the foundation of a calculation of the above formula. Therefore, it is possible to calculate partial models in a simple way, which are each based on only a part of the supporting point data. A subsequent addition of the individual calculation results leads to the function value of the data-based function model.

Thus, in the case of a model calculation unit having M available computing cores, a calculation of the function model may be carried out using N D-dimensional supporting points, in that the function model is divided into M partial models, the first partial model using supporting points $x_{p,d}$ having $d=1, \ldots, D$, and $p=1, \ldots, n1$, the second partial model using supporting points $x_{q,d}$ having $q=n1+1, \ldots, n2$, etc., the number of the supporting points being able to be equal or different.

In other words, for example, supporting point data $x_i$ may be used in partial models, in which in a first partial model supporting point data $x_p$ having $p=1, \ldots, N/M$ are used, in a second partial model supporting point data $x_q$ having $q=N/M+1, \ldots, N\times 2/M$ are used, etc.

$$v_1 = \sum_{p=1}^{N/M} (Q_y)_i \sigma_f \exp\left(-\frac{1}{2} \sum_{d=1}^{D} \frac{((x_p)_d - u_d)^2}{l_d}\right)$$

$$v_2 = \sum_{q=\frac{N}{M}+1}^{\frac{N}{M}} (Q_y)_i \sigma_f \exp\left(-\frac{1}{2} \sum_{d=1}^{D} \frac{((x_q)_d - u_d)^2}{l_d}\right)$$

etc.
and in general:

$$v_m = \sum_{i=(m-1)*N/M+1}^{m\frac{N}{M}} (Q_y)_i \sigma_f \exp\left(-\frac{1}{2} \sum_{d=1}^{D} \frac{((x_i)_d - u_d)^2}{l_d}\right)$$

$$m = 1, \ldots, M$$
$$M \geq 2$$

Furthermore, the calculation of a data-based function model in model calculation unit 6 is carried out in such a way that individual supporting points $x_i$ in the supporting point data are calculated successively. Therefore, according to the flow chart of FIG. 2, it is provided that the transfer of the configuration data into model calculation unit 6 is started and the calculation of the data-based function model in computing core 62 is started already during the transfer of the configuration data, i.e., before the configuration data for calculating the data-based function model have been completely transferred. It is only to be provided in this case that the next supporting points have already been loaded into internal memory 61, before the supporting point data previously loaded into internal memory 61 have been completely used in the calculation. In this way, it may be ensured that the calculation is continued in computing core 62 without interruption.

Figure 2:
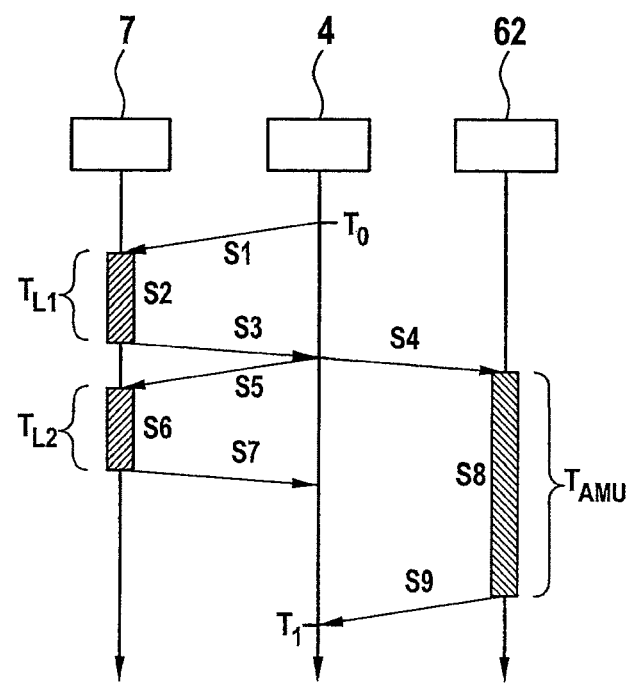
FIG. 2 shows a schematic view of a sequence of a calculation of a data-based function model in a model calculation unit having a computing core.

FIG. 2 shows on the basis of a flow chart for an example of model calculation unit 6 having only one active computing core 62 that in a first step S1, computing unit 4 instructs DMA unit 7 at a starting point in time $T_o$ to transfer the configuration data for calculating the data-based function model into model calculation unit 6.

The transfer of the configuration data is started in step S2 and after a period of time $T_{L1}$, i.e., after the transfer of a first part of the configuration data to be transferred, in step S3, computing unit 4 is informed by DMA unit 7 of the completion of the transfer of the first part of the configuration data to be transferred.

Thereafter, computing unit 4 starts the calculation in model calculation unit 6 with step S4. Essentially simultaneously or offset in time, DMA unit 7 may be instructed to transfer a further part of the configuration data to computing core 62 of model calculation unit 6 (step S5).

While the transfer of the next part of the configuration data by DMA unit 7 to model calculation unit 6 is carried out, in step S8, the calculations are carried out in model calculation unit 6 based on the first part of the configuration data during a period of time $T_{AMU}$. As soon as all configuration data have been transferred after time $T_{L2}$ in step S6, this may be communicated accordingly to computing unit 4 (step S7).

Furthermore, the completion of the calculations in computing core 62 is communicated to computing unit 4 in step S9. At an end point in time $T_1$, the calculation result is available in computing unit 4.

The transfer of the further part of the configuration data may be carried out multiple times.

Figure 3:
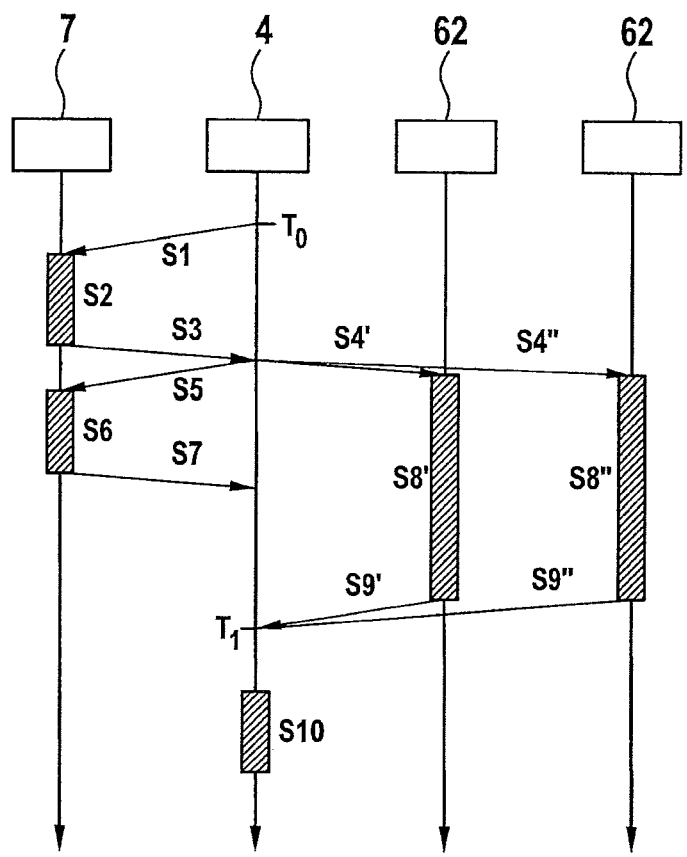
FIG. 3 shows a schematic view of a sequence of a calculation of a data-based function model in a model calculation unit having two computing cores.

If more than one computing core 62, for example, two computing cores 62, are provided in model calculation unit 6, the method may also be carried out according to the flow chart of FIG. 3. Therein, as a first part of the configuration data, the supporting points both for the calculation of a first partial model in a first computing core 62 and for the calculation of a second partial model in a second computing core 62 are transferred. For example, in first computing core 62, calculations may be carried out for the supporting points at every even position and in second computing core 62, calculations may be carried out for the supporting points at every odd position in internal memory 61.

For example, in the case of a model calculation unit having M available computing cores, a calculation of the function model having N D-dimensional supporting points may be carried out, in that the function model is divided into M partial models, the first partial model using supporting points $x_{p,d}$ having $p=1, M+1, 2M+1, \ldots$, and the second partial model using supporting points $x_{q,d}$ having $q=2, M+2, 2M+2, \ldots$, etc. In general, the following condition applies for this partial model allocation:

$$v_m = \sum_{i=1}^{\left|\frac{N+M-m}{M}\right|} (Q_y)_{(i-1)M+m} \sigma_f \exp\left(-\frac{1}{2}\sum_{d=1}^{D}\frac{((x_{(i-1)M+m})_d - u_d)^2}{l_d}\right)$$

$$m = 1, \ldots, M$$
$$M \geq 2$$

In contrast to step S4 of the above-described method in conjunction with FIG. 2, in steps S4' and S4", the calculation is started essentially simultaneously both in first computing core 62 and in second computing core 62.

The two computing cores 62 then access the even or odd supporting points in the first part of the configuration data. Simultaneously, in steps S5 and S6, a further part of the configuration data is loaded into internal memory 61 as described above. In the case of the use of multiple computing cores 62 for calculating partial models of a data-based function model, the calculations are carried out in steps S8' and S8", and partial calculation results $v_1$, $t_2$, etc., of the individual partial models must subsequently still be added in a step S10 to the calculation results of steps S9' and S9", to obtain the function value of the data-based function model.

Figure 4:
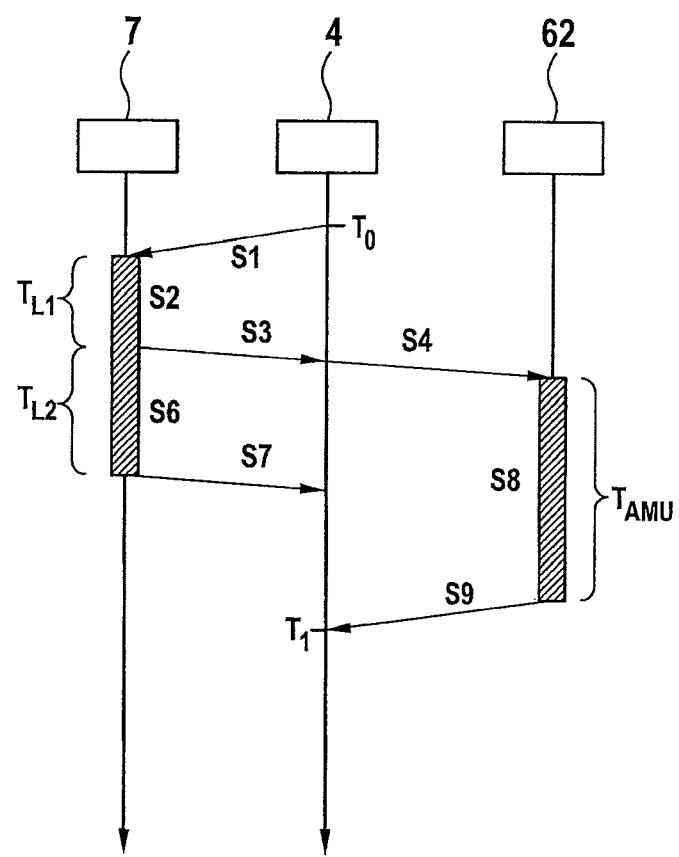
FIG. 4 shows a schematic view of a sequence of a calculation of a data-based function model in a model calculation unit having a computing core during a continuous transmission process.

The loading of the parts of the configuration data may also be carried out, as shown in the diagram of FIG. 4, in a joint, uniform transfer process. The communication of the completion of the transfer of the first part of the configuration data to be transferred in step S3 may be carried out during this transfer, as soon as the first part of the configuration data has been transferred. The communication may be carried out in the form of an interrupt at the computing unit. In this specific embodiment, step S5 may be omitted, since the transfer of the second part of the configuration data in a joint transfer process does not require an additional starting command.

The above-mentioned method is also arbitrarily expandable to model calculation units 6 having more than two computing cores 62. In the case of the simultaneous start of the calculations in individual computing cores 62, it is to be ensured that the first part of the transferred configuration data contains sufficient supporting points for the start of the calculations in all computing cores 62.

What is claimed is:

1. A method for performing a calculation of a data-based function model in a control unit, the method comprising:
    loading a first part of configuration data, which contain a first part of supporting point data having multiple supporting points, into a model calculation unit, wherein the control unit includes a computing unit and the model calculation unit, which is a separate model calculation unit having a computing core;
    starting a calculation in the computing core of the model calculation unit to obtain a model value at a predefined test point, wherein the calculation is started before the first part of the configuration data is completely loaded;
    transferring a second part of the configuration data, which contain a second part of the supporting point data having multiple supporting points, into the model calculation unit, prior to a completion of the calculation in the computing core of the model calculation unit;
    calculating in the computing unit at least one output variable with an aid of the calculation in the computing core of the model calculation unit; and
    operating an internal combustion engine based on the output variable by controlling at least one of an actuator and an injector of the internal combustion engine based on the output variable.

2. The method of claim 1, wherein the transfer of a second part of the configuration data is started simultaneously with the calculation in the model calculation unit.

3. The method of claim 1, wherein the model calculation unit has multiple computing cores, in which the calculations are started after or immediately after the loading of the first part of the configuration data, the calculations in the computing cores each being carried out using a part of the first part of the supporting points.

4. The method of claim 3, wherein, in the case of a number M of computing cores, the calculations in the computing cores are each carried out using assigned supporting points of the first part of the supporting point data, those supporting points being assigned to each of the computing cores which result from a successive assignment of groups of one or multiple supporting points from the first part of the supporting point data to individual ones of the computing cores, so that parts of the first part of the supporting points of each Mth group of one supporting point or multiple supporting points are assigned offset to one another.

5. The method of claim 3, wherein the calculation results of the calculations in individual ones of the computing cores are added up to obtain the total model value.

6. The method of claim 1, wherein the data-based function model is a Gaussian process model.

7. The method of claim 1, wherein the loading of the first part of the configuration data and the second part of the configuration data are executed as a coherent transfer process.

8. A control unit for performing a calculation of a data-based function model, comprising:

a computing unit;
a separate model calculation unit having at least one computing core, which is configured to calculate a data-based function model; and
a direct memory access (DMA) unit configured to (i) load a first part of configuration data, which contain a first part of supporting point data having multiple supporting points, into the model calculation unit, and (ii) transfer a second part of the configuration data, which contain a second part of the supporting point data having multiple supporting points, into the model calculation unit, prior to a completion of the calculation in the computing core of the model calculation unit;
wherein the computing unit is configured to start a calculation in the at least one computing core of the model calculation unit to obtain a model value at a predefined test point, wherein the calculation is started before the first part of the configuration data is completely loaded;
wherein the computing unit calculates at least one output variable with an aid of the calculation in the computing core of the model calculation unit;
wherein an internal combustion engine is operated based on the output variable by controlling at least one of an actuator and an injector of the internal combustion engine based on the output variable.

9. The control unit of claim 8, wherein for multiple computing cores in the model calculation unit, calculation results are obtained from individual ones of the computing cores and are added to the model value.

10. The control unit of claim 8, wherein the data-based function model is a Gaussian process model.

11. A non-transitory computer readable medium having a computer program, which is executable by a processor, comprising:
a program code arrangement having program code for performing a calculation of a data-based function model in a control unit, by performing the following:
loading a first part of configuration data, which contain a first part of supporting point data having multiple supporting points, into a model calculation unit, wherein the control unit includes a computing unit and the model calculation unit, which is a separate model calculation unit having a computing core;
starting a calculation in the computing core of the model calculation unit to obtain a model value at a predefined test point, wherein the calculation is started before the first part of the configuration data is completely loaded;
transferring a second part of the configuration data, which contain a second part of the supporting point data having multiple supporting points, into the model calculation unit, prior to a completion of the calculation in the computing core of the model calculation unit;
calculating in the computing unit at least one output variable with an aid of the calculation in the computing core of the model calculation unit; and
operating an internal combustion engine based on the output variable by controlling at least one of an actuator and an injector of the internal combustion engine based on the output variable.

12. The computer readable medium of claim 11, wherein the transfer of a second part of the configuration data is started simultaneously with the calculation in the model calculation unit.

13. The computer readable medium of claim 11, wherein the model calculation unit has multiple computing cores, in which the calculations are started after or immediately after the loading of the first part of the configuration data, the calculations in the computing cores each being carried out using a part of the first part of the supporting points.

14. The computer readable medium of claim 13, wherein, in the case of a number M of computing cores, the calculations in the computing cores are each carried out using assigned supporting points of the first part of the supporting point data, those supporting points being assigned to each of the computing cores which result from a successive assignment of groups of one or multiple supporting points from the first part of the supporting point data to individual ones of the computing cores, so that parts of the first part of the supporting points of each Mth group of one supporting point or multiple supporting points are assigned offset to one another.

15. The computer readable medium of claim 13, wherein the calculation results of the calculations in individual ones of the computing cores are added up to obtain the total model value.

16. The computer readable medium of claim 11, wherein the data-based function model is a Gaussian process model.

17. The computer readable medium of claim 11, wherein the loading of the first part of the configuration data and the second part of the configuration data are executed as a coherent transfer process.

18. A non-transitory electronic storage medium having a computer program, which is executable by a processor, comprising:
a program code arrangement having program code for performing a calculation of a data-based function model in a control unit, by performing the following:
loading a first part of configuration data, which contain a first part of supporting point data having multiple supporting points, into a model calculation unit, wherein the control unit includes a computing unit and the model calculation unit, which is a separate model calculation unit having a computing core;
starting a calculation in the computing core of the model calculation unit to obtain a model value at a predefined test point, wherein the calculation is started before the first part of the configuration data is completely loaded; and
transferring a second part of the configuration data, which contain a second part of the supporting point data having multiple supporting points, into the model calculation unit, prior to a completion of the calculation in the computing core of the model calculation unit;
calculating in the computing unit at least one output variable with an aid of the calculation in the computing core of the model calculation unit; and
operating an internal combustion engine based on the output variable by controlling at least one of an actuator and an injector of the internal combustion engine based on the output variable.

19. An electronic control unit, comprising:
a memory having a computer program, which is executable by a processor, including:
a program code arrangement having program code for performing a calculation of a data-based function model in a control unit, by performing the following:
loading a first part of configuration data, which contain a first part of supporting point data having multiple supporting points, into a model calculation unit, wherein the control unit includes a computing unit and the model calculation unit, which is a separate model calculation unit having a computing core;

starting a calculation in the computing core of the model calculation unit to obtain a model value at a predefined test point, wherein the calculation is started before the first part of the configuration data is completely loaded; and transferring a second part of the configuration data, which contain a second part of the supporting point data having multiple supporting points, into the model calculation unit, prior to a completion of the calculation in the computing core of the model calculation unit;

calculating in the computing unit at least one output variable with an aid of the calculation in the computing core of the model calculation unit; and operating an internal combustion engine based on the output variable by controlling at least one of an actuator and an injector of the internal combustion engine based on the output variable.

* * * * *